United States Patent
Puglisi et al.

(10) Patent No.: US 11,978,633 B2
(45) Date of Patent: May 7, 2024

(54) MOLECULAR DOPING

(71) Applicant: Consiglio Nazionale Delle Ricerche, Rome (IT)

(72) Inventors: Rosaria Anna Puglisi, Rome (IT); Sebastiano Caccamo, Rome (IT)

(73) Assignee: Consiglio Nazionale Delle Ricerche, Rome (IT)

( * ) Notice: Subject to any disclaimer, the term of this patent is extended or adjusted under 35 U.S.C. 154(b) by 0 days.

(21) Appl. No.: 17/608,956

(22) PCT Filed: May 8, 2020

(86) PCT No.: PCT/IB2020/054377
§ 371 (c)(1),
(2) Date: Nov. 4, 2021

(87) PCT Pub. No.: WO2020/225789
PCT Pub. Date: Nov. 12, 2020

(65) Prior Publication Data
US 2022/0216057 A1    Jul. 7, 2022

(30) Foreign Application Priority Data

May 8, 2019   (IT) .................. 102019000006641

(51) Int. Cl.
*H01L 21/225* (2006.01)
*H01L 21/02* (2006.01)

(52) U.S. Cl.
CPC .... *H01L 21/2255* (2013.01); *H01L 21/02227* (2013.01); *H01L 21/02307* (2013.01); *H01L 21/02334* (2013.01); *H01L 21/02362* (2013.01)

(58) Field of Classification Search
CPC .......... H01L 21/2255; H01L 21/02227; H01L 21/02307; H01L 21/02334; H01L 21/02362
See application file for complete search history.

(56) References Cited

U.S. PATENT DOCUMENTS

| 2005/0181566 A1 | 8/2005 | Machida et al. |
| 2007/0066071 A1* | 3/2007 | Chen .................. C11D 11/0047 430/4 |

(Continued)

FOREIGN PATENT DOCUMENTS

WO    2014/120392 A1    8/2014

OTHER PUBLICATIONS

Shin-Etsu MicroSi, Silicon Wafer Cleaning, Aug. 5, 2013.*

(Continued)

*Primary Examiner* — Yara B Green
*Assistant Examiner* — Fakeha Sehar
(74) *Attorney, Agent, or Firm* — Seed IP Law Group LLP (57) ABSTRACT

Method of doping a semiconductor sample in a uniform and carbon-free way, wherein said sample has a surface, comprising the following steps: A. removing oxides from at least part of the said surface; B. dip coating said at least part of the surface of the sample in a dopant based carbon-free solution of at least one dopant based carbon free substance diluted in water, wherein said at least one dopant based carbon free substance has a molecule comprising at least one dopant atom, wherein the dip coating is achieved by heating said dopant based carbon-free solution at a dip coating temperature from 65% to 100% of the boiling temperature of said dopant based carbon-free solution, thereby a self-assembled mono-layer including dopant atoms is formed; C. annealing said sample, wherein the annealing is configured (Continued)

to cause said dopant atoms included in said self-assembled mono-layer to be diffused into the sample.

20 Claims, 4 Drawing Sheets

(56) References Cited

U.S. PATENT DOCUMENTS

| | | | |
|---|---|---|---|
| 2012/0003826 A1 | 1/2012 | Pollard et al. | |
| 2014/0124896 A1 | 5/2014 | Hochstetler et al. | |
| 2015/0111372 A1 | 4/2015 | Tieckelmann et al. | |
| 2015/0325442 A1* | 11/2015 | Wiedmann | H01L 29/66803 252/500 |
| 2015/0380249 A1* | 12/2015 | Gouk | H01L 21/02043 438/559 |
| 2018/0245204 A1 | 8/2018 | Hou et al. | |

OTHER PUBLICATIONS

University of Pennsylvania, Wet Processing, https://www.seas.upenn.edu/~nanosop/Wet_Processing_SOP.htm.*

Duffy et al.; Diagnosis of phosphorus monolayer doping in silicon based on nanowire electrical characterisation. Journal of Applied Physics Mar. 28, 2018; 123 (12): 125701. https://doi.org/10.1063/1.5019470.*

Ho et al., "Controlled nanoscale doping of semiconductors via molecular monolayers," *Nature Materials* 7:62-67, Nov. 11, 2007.

Longo et al., "Monolayer Doping via Phosphonic Acid Grafting on Silicon: Microscopic Insight from Infrared Spectroscopy and Density Functional Theory Calculations," *Advanced Functional Materials* 23:3471-3477, Feb. 18, 2013.

Moon et al., "Investigation on phosphorus doping using $H_3PO_4$ as doping source by simple dip method and its electrical characterization," *Surface Engineering* 25(2):151-155, 2009.

Shimizu et al., "Behavior of phosphorous and contaminants from molecular doping combined with a conventional spike annealing method," *Nanoscale*, 6:706-710, 2014.

* cited by examiner

MOLECULAR DOPING

TECHNICAL FIELD

The present invention concerns a method for doping semiconductor substrates by dip coating. In said method a controlled uniform distribution of the dopants in the semiconductor is achieved.

A semiconductor substrate is immersed in an aqueous solution containing impurity molecules and/or ions, said solution when in contact with the surface of the substrate forms a self-assembled monolayer which is ordered and compact. The water diluted solution is eco-friendly, cheaper and more sustainable if compared to the semiconductor doping methods presented in the cited prior art documents. Through a subsequent heat treatment, the dopant atoms diffuse inside the substrate. Being the dopant precursor in liquid form, said method allows conformal doping, even in hollow and three-dimensional (3D) complex structures.

STATE OF THE ART

The most recent roadmap for the semiconductor field requires that the devices operate at low voltage and low power, while maintaining high performance and low manufacturing costs. As a solution to these technological requirements, it has been proposed to fabricate the devices, now reaching nanometric sizes, on structures with 3D geometries. In this context, prior art methods of doping have strong limitations, because they do not allow the doping of silicon to be carried out in such a way that it follows the 3D nanostructured surfaces, i.e. they do not allow to make 'conformal' doping.

In addition, prior art methods need to use expensive equipment and materials in order to avoid the formation of structural defects within the silicon, typically only partially solved by subsequent heating, the uncontrolled formation of precipitates and poor manageability in the realization of specific applications such as ultra-thin junctions (under 10 nm). Recently, an alternative method of doping has been proposed based on the use of liquid solutions, the Molecular Doping (MD). The dopant precursor is in liquid form and the semiconductor (e.g.: silicon, germanium, or gallium arsenide) is immersed in the solution.

During the immersion process, the molecule containing the dopant atom is deposited on the surface of the material. Being the precursor of the dopant in liquid form and coming into direct contact with the surface to be treated, MD allows conformal doping, i.e. it follows the surface of complex structures, such as nanostructured, porous or hollow ones. The phrase "nanostructured materials" implies two important ideas:
  i) at least some of the property-determining heterogeneity in materials occurs in the size range of nanostructures (1-100 nm), and
  ii) these nanostructures might be synthesized and distributed (or organized), at least in part, by design.

Prior art methods use organic molecules, such as esters or alcohols, as precursor dopant sources.

In the article "Controlled nanoscale doping of semiconductors via molecular monolayers" by Johnny C. Ho at al., published online on 11 Nov. 2007, doi:10.1038/nmat2058, the authors doped silicon (Si) wafers by firstly treating the Si surfaces with a dopant dissolved in mesitylene (the dopant being allylboronic acid pinacol ester far p-doped wafers, and diethyl-1-propylphosphonate, known as DPP, for n-doped wafers), and subsequently annealing the material to diffuse the dopant atoms into the surface and achieve a n+/p Ultra Shallow Junctions.

In the method explained in Pollard et al., "Methods and Compositions For Doping Silicon Substrates With Molecular Monolayers" US 2012/0003826 A1, firstly, a Si surface is cleaned in advance to remove oxides, secondly the semiconductor substrate surface is put in contact with a diluted dopant solution comprising tetraethylene glycol dimethyl ether (tetraglyme) and a dopant material such as DPP or allylboronic acid pinacol ester. As in Ho et al., the method shown in US 2012/0003826 A1 comprises a subsequent rapid thermal annealing so as a diffusion step of the dopant ions in the substrate is achieved.

However, a determining aspect that has prevented a wide and extensive development of the methodologies described in the document by Ho at al. and in the patent application US2012/0003826A1 in the industrial field is linked to the problem that the atoms constituting the molecule can diffuse together with the dopant atoms in the first sample layers.

Generally, for n-type doping, DPP dissolved in mesitylene is used. When the molecule is decomposed to release the dopant atom to be diffused into the silicon, the atoms that constitute the molecule, such as carbon, are also released and can play a role from an electrical point of view within the Si. It is known indeed that carbon is identified as a benign contaminant for some devices, such as MOS and bipolar devices, but in others, such as high voltage diodes and transistors, at concentrations higher than $5 \times 10^{16}$ cm$^{-3}$, it forms structural defects and electronic deep traps in the Si bandgap and consequently it deteriorates the device electrical properties. Moreover, in the case of diffusion phenomena at low depths, about 2-3 nm, with concentrations higher than $1 \times 10^{21}$ cm$^{-3}$ it forms a thin layer of silicon carbide (SiC) resistant to chemical etch. Although this layer is confined to the surface, this has been identified as one of the limits of the technique.

Rapid and extensive industrial exploitation has therefore raised the need for a method that can limit or eliminate the carbon presence altogether. Some works in the literature have proposed the use of alternative precursors to the DPP to reduce the carbon impact, but always without eliminating it, e.g. as disclosed in "Behavior of phosphorous and contaminants from molecular doping combined with a conventional spike annealing method" by Yasuo Shimizu et al., published on 27 Nov. 2013, Nanoscale, 2014, 6, 706, and in document US 2005/181566 A1, providing further inconveniences which made the technological process less attractive.

For example, in document US 2005/181566 A1, a method for doping impurities and different methods for producing a semiconductor device and an applied electronic apparatus are presented. In one of such methods suitable for the production of thin-film semiconductor elements, known as TFT, a solution containing impurity ions is applied onto the surface of a silicon film to form a solution conventional layer, followed by drying into a compound layer containing the impurities. A subsequent heat annealing treatment is performed by irradiation with an energy beam so as to diffuse the impurity atoms in the compound layer toward the silicon film.

Said solution does not contain carbon impurities, however an irradiation with an energy beam, more specifically by a laser beam (laser activation), is necessary to have the impurities diffused in the silicon film.

In particular, document US 2005/181566 A1 teaches how a dopant ion implantation is provided, locally and selectively, through a phosphoric acid (PA or $H_3PO_4$) based precursor in a MD process for plastic substrates suitable for the production of thin-film semiconductor elements.

However, this approach lacks uniformity in terms of dopants distribution, cost-efficiency due to a laser source necessity and it is also time-consuming due to the iterative and selective utilization of the laser beam.

Due to the limited dimension of the laser focal spot, non-uniform changes in the physical and chemical properties of the implanted substrates are generated. In fact, many parameters, such as morphology, hardness, optical and mechanical properties, wetting ability and nanostructure generation are modified only locally on selected areas per time also if the laser sources would be used on array.

Moreover, laser activation needs dedicated facilities in terms of light sources and special controls which are more expensive and more complicated than other standard thermal annealing.

Furthermore, this kind of beam energy annealing is not effective to achieve a conformal doping on hidden surfaces of complex tri-dimensional structures, such as nanostructured, porous or hollow ones, which would not be achieved by a laser beam activation.

The step of dipping the semiconductor in an aqueous ambient temperature solution does not ensure any fine controllability of the dopant coating achieved in the doping process.

The article "Investigation on phosphorus doping using $H_3PO_4$ as doping source by simple dip method and its electrical characterisation" by I. Moon, Surface Engineering 2009, VOL 25 No. 2, teaches how to improve uniformity in a MD process. Moon presents a work on emitter diffusion in crystalline silicon solar cell fabrication disclosing a phosphorus doping using phosphoric acid with dipping. Wafers were initially coated with a phosphorus layer using PA ($H_3PO_4$), and n+ emitter diffusion was induced by annealing at 850° and 900° for 5 min. Different organic solvents were used to dilute $H_3PO_4$ in preparation of a dipping solution (emulsion) for fabrication of a $P_2O_5$ layer on the silicon wafer. $H_3PO_4$ was mixed with different solvents such as deionised water, ethanol, methanol and butanol. However, deionised water resulted hydrophobic to the silicon surface, instead butanol as a solvent exhibited uniform sheet resistance over the wafer surface, compared to other solvents.

Furthermore, butanol, as well as ethanol and methanol, has several C—H bonds in a single molecule thus the doped sample obtained is a carbon contaminated sample, moreover a phosphorus silicate glass (PSG) layer is formed on the sample surface which needs to be removed by a further expensive process.

It is an object of this invention, therefore, to overcome the aforementioned problems of the prior art devices and processes, namely by allowing in a simple, reliable, efficient, eco-friendly and inexpensive way, to dope a semiconductor sample, even a semiconductor sample having complex, three-dimensional and hollow structure, possibly with high concentrations of dopant atoms and a planned and uniform distribution of said atoms under the surface of the sample.

SUMMARY OF INVENTION

It is specific subject-matter of the present invention a method of doping a semiconductor sample in a uniform and carbon-free way, wherein said sample has a surface, comprising the following steps:
A. removing oxides from at least part of the said surface;
B. dip coating said at least part of the surface of the sample in a dopant based carbon-free solution of at least one dopant based carbon free substance diluted in water, wherein said at least one dopant based carbon free substance has a molecule comprising at least one dopant atom, wherein the dip coating is achieved by heating said dopant based carbon-free solution at a dip coating temperature ranging from 65% to 100% of the boiling temperature of said dopant based carbon-free solution, thereby the dip coating is configured to form a self-assembled mono-layer including dopant atoms; and
C. annealing said sample, wherein the annealing is configured to cause said dopant atoms included in said self-assembled mono-layer to be diffused into the sample.

According to another aspect of the invention, said dip coating temperature may range from 80% to 100%, optionally from 90% to 100%, of the boiling temperature of said dopant based carbon-free solution, wherein said dip coating temperature is more optionally equal to the boiling temperature of said dopant based carbon-free solution.

According to a further aspect of the invention, in step B, said dopant based carbon-free solution may be boiled for a period of time ranging from 2 to 3 hours.

According to an additional aspect of the invention, in step B, the dip coating step may be configured to form one or more layers including dopant atoms on top of said self-assembled mono-layer.

According to another aspect of the invention, said at least one dopant atom comprised in said molecule may be double linked to a corresponding oxygen atom.

According to a further aspect of the invention, said at least one dopant atom may be selected from the group comprising or consisting of phosphor and boron.

According to another aspect of the invention, said at least one dopant based carbon free substance may be selected from the group comprising or consisting of phosphoric acid, boric acid and metaboric acid.

According to an additional aspect of the invention, said semiconductor may be selected from the group comprising or consisting of silicon (Si), gallium nitride (GaN), gallium arsenide (GaAs), germanium (Ge), silicon carbide (SIC), graphene, silicene, germanene, stanene and other elemental two-dimensional materials.

According to a further aspect of the invention, said dopant based carbon-free solution may comprise a volume of phosphoric acid ranging from 15% and 30%, optionally between 17% and 25%, more optionally between 18% and 22%, even more optionally of 20% or a volume of metaboric and/or boric acid ranging from of 15% and 30%, optionally between 17% and 25%, more optionally between 18% and 22%, even more optionally of 20%.

According to an additional aspect of the invention, said based carbon-free solution may comprise a volume of water ranging from 70% and 85%, optionally from 75% and 83%, more optionally from 78% and 82%, more optionally 80%.

According to an additional aspect of the invention, said step C may be achieved by heating said sample at a temperature ranging from 1000° C. to 1100° C. for a period ranging from not less than 5 sec, optionally from not less than 20 sec, more optionally not more than 1000 sec, even more optionally not more than 500 sec.

According to another aspect of the invention, before step A, the following step may be executed:
D. cleaning said at least part of the surface to remove the organic and non-organic surface contaminants.

According to a further aspect of the invention, said step D may be achieved by cleaning said at least part of the surface in ultrasonic in one or more cleaning solutions selected from the group comprising acetone, alcohol and water.

According to an additional aspect of the invention, said step D may be achieved by executing a cleaning sequence of
- a first sub-step of dipping said at least part of the surface in an acetone solution,
- a second sub-step of extraction from the solution and drying said at least part of the surface,
- a third sub-step of dipping said at least part of the surface in an alcohol solution,
- a fourth sub-step of extraction from the solution and drying said at least part of the surface,
- a fifth sub-step of dipping said at least part of the surface in an aqueous solution,
- a sixth sub-step of extraction from the solution and drying said at least part of the surface.

According to another aspect of the invention, said step A may be achieved by immersing said at least part of the surface in a hydrofluoric acid solution.

According to a further aspect of the invention, the following step may be performed before said step C:
E. capping said least part of the surface with a layer of oxide According to an additional aspect of the invention, said step E may be achieved by depositing a Spin on Glass procedure or by Chemical Vapor Deposition.

The advantages offered by the method of doping a semiconductor according to the invention are numerous and significant.

The method according to the invention allows to dope a semiconductor in a more efficient and less expensive manner with respect to the prior art. A better efficiency in doping complex, three-dimensional and hollow semiconductor structures is achieved through a simpler and cost-effective process wherein an eco-friendly and water diluted molecular precursor such as phosphoric acid, boric or metaboric acid may be used.

Moreover, a higher concentration of dopant atoms and a planned and uniform distribution of said atoms under the surface of the sample is achieved through the formation of self-assembled monolayers on the sample semiconductor surface to be doped.

In fact, in the present invention, the use of ordered nanostructures overcomes typical issues in electronics such as costs, efficiency, sustainability and reliability and furthermore push the advancement of the technology.

The method according to the invention uses a completely carbon-free precursor, and in the preferred embodiment such a completely carbon-free precursor is a precursor of phosphorus, namely phosphoric acid (PA).

In the following the term "substance" will be used to mean the precursor used in the invention.

PA has been selected in the preferred embodiment because of its molecular structure is composed only of oxygen, hydrogen and phosphorus, and no carbon atoms are present.

The inventors have developed said method to avoid unwanted contaminants inside the substrate during the annealing process. To this end they tested said PA innovative molecular precursor to eliminate the carbon atoms constituting the molecular precursor.

Another of the advantages of PA is that it is already widely used in microelectronics factories because it is used in the removal of silicon nitride, one of the most common compounds. Furthermore, it can be diluted in water, rather than in organic solvents such as mesitylene or ethanol used in the traditional MD method. This allows a further degree of cleaning and sustainability of the method according to the invention.

Furthermore, the inventors discovered that the ability to modulate some of the coating main parameters (such as the time of immersion and the molecular precursor concentration) corresponds to having a control over the MD deposition technique and then to having an ability to design and to prepare a sample with the desired characteristics.

After the dip coating and a subsequently heat treatment, the molecule decomposes and the dopant diffuses inside the semiconductor. Since the precursor is in liquid form, MD intrinsically allows conformal doping, even in hollow structures. Moreover, the density and the positions of the dopant atoms on the surface of the semiconductor are fixed by the self-assembly mechanism, allowing to eliminate all the problems related to the arrival at a nanometric scale of the dopant atoms on the semiconductor surface, as occurs in traditional ion implantation, plasma or gas methods.

The present invention concerns a 'self-assembly' method allowing structures (in principle, structures of any size, but especially nanostructures) synthesized to organize themselves into regular patterns or structures by using local forces to find the lowest-energy configuration. Self-assembly is particularly useful because it allows the aggregation of structures too small to be manipulated individually or conveniently into the 3D ordered arrays or patterns that often give function to materials.

The inventors have ascertained that, in the case where a single monolayer is formed on the surface, a higher control on the MD process is achieved and that, in the case where multilayers are formed, a higher concentration of dopants in the sample is achieved.

The method according to the invention guarantees an intrinsic order and uniform distribution of the source atoms on the surface of the target and controls the amount of initial dose of dopant and of the final incorporated dopant in the substrate and it is therefore pre-determined once the molecule is designed. During this process, the molecule bonds to the target surface with a self-limiting process ruled by its steric properties. The molecular footprint of the precursor directly governs the surface concentration of the dopants with larger molecules resulting in a lower dose.

In addition to its carbon-free structure, the promising results obtained by PA in the preferred embodiment of the invention can be attributed to the small size of the molecule of phosphoric acid with respect to other precursors such as DPP. Its steric footprint has a ratio (phosphorus:rest of atoms) equal to 1:8, which allows for a greater packing and consequently a pre-determined higher surface density of dopant atoms than the DPP, which has a ratio (phosphorus: rest of atoms) equal to 1:28.

Other embodiments of the invention can similarly make use of boric acid and/or meta boric acid in place of the PA.

Another aspect investigated in this invention is the role of solvent and the molecular precursor at the MD. The inventors have successfully used water as solvent, instead of mesitylene which is generally used in prior art PA methods, where water is non-toxic, non-polluting, easily available, inexpensive and carbon-free.

BRIEF DESCRIPTION OF THE DRAWINGS

The present invention will be now described, by way of illustration and not by way of limitation, according to its preferred embodiments, by particularly referring to the Figures of the annexed drawings, in which.

In the Figures identical reference numerals will be used for alike elements.

DETAILED DESCRIPTION OF THE INVENTION

In the following of the present description, the invention will be disclosed with reference to silicon as semiconductor material of which the sample is made of and to phosphoric acid as a n-type molecular dopant precursor. However, it should be noted that the method according to the invention is also applicable to other types of semiconductor materials such as GaN, Ge, GaAs, SiC, graphene, silicene, germanene, stanene, other elemental two-dimensional materials and other dopant molecules may be used in case of p-type molecular doping such as boric acid and/or metaboric acid.

Figure 1:
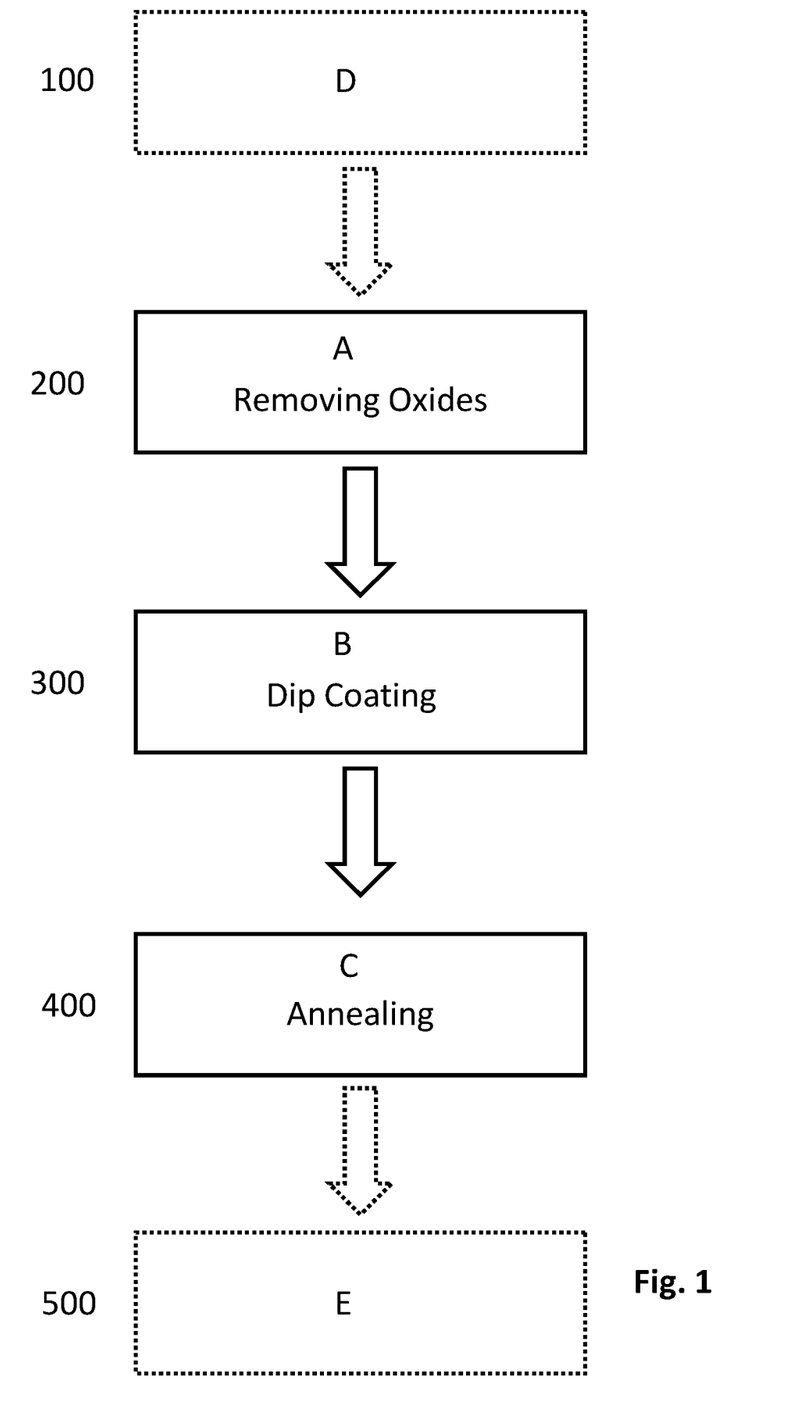
FIG. 1 shows a flow chart of the preferred embodiment of the doping method according to the invention.

With reference to FIG. 1, the first embodiment of the method according to the invention dopes a silicon (Si) sample in a uniform and carbon-free way, wherein said sample has a surface, and comprises the following steps:

A. removing (200) oxides from at least part of the said surface;

B. dip coating (300) said at least part of the surface of the sample in a solution of phosphoric acid diluted in water; and C. annealing (400) said sample.

In step A, the preferred method for removing the native silicon dioxide ($SiO_2$) naturally present on the Si surface includes immersing the sample in a hydrofluoric acid solution (HF).

In step B, the dip coating is configured to form a self-assembled mono-layer including dopant atoms, namely phosphorous atoms, and such dip coating is achieved by boiling in said solution said at least part of the surface of the sample.

Preferably, the sample is immersed in a 20% solution of phosphoric acid in water and boiled at a temperature of 120° C. for a period of time ranging from 2 to 3 hours, optionally substantially equal to 2.5 hours.

The deposition process takes place at the boiling point of the solution, guaranteeing two advantages: the formation of the chemical bond between the Si atoms and the self-controlled maintenance of the process temperature, since all the heat supplied is absorbed by the boiling phenomenon. The higher the similarity of the boiling temperatures of solvent and solute in the solution is, the better the control of the dopant distribution on the sample surface.

The boiling temperature of the solution, composed by the solvent and the solute, depends on the chosen solvent and solute and on the atmospheric pressure conditions. Under given atmospheric pressure, the boiling temperature of the solution depends on the relative concentration of the two components of the solution. In the specific case of water and phosphoric acid at 1 atm (1.01325 $10^5$ Pascal), the boiling point of the solution, at the mentioned concentration of 20% of phosphoric acid in water, ranges between 120° C.-130° C. These values were predicted first by a calculation, and then also experimentally measured during the process. Bringing the solution to boiling, energy is supplied to the molecules which forms a covalent bond with the semiconductor substrate, silicon in the preferred embodiment of the method according to the invention, forming a first organized self-assembled monolayer on the sample surface.

In the phosphoric acid the phosphorus (P) is bound to an oxygen (O) atom through a double bond that is energetically favoured for the formation of the bond with the silicon (Si).

In order to have the formation of a monolayer, chemically bonded to the substrate, it is necessary to break the double bond P=O and simultaneously create a bond between P, O and Si. in this way, the molecules are directly linked to the substrate by chemical bonds, the molecules that will be located above the monolayer will be bound by physical bonds.

The experiments show that during the deposition process for MD the formation of both a monolayer chemically bonded to the substrate and of the multilayers physically linked to it may possibly occur.

From the results of the experiments, it appears that the formation process of further upper multilayers, since they are weakly bound to the underlying molecules, does not depend on the boiling temperature of the solution, but on the process time. In particular, on top of the first SAM bonded to the substrate, it cannot be ensured that the other layers formed over the first one are SAMs as well because of the possible intervention of physical bonds along with chemical bonds.

When the deposited layer forms a single self-assembled layer, the molecules are spaced therein according to their steric bulk. As a result, their mutual distance is pre-determined and controlled by their size. This involves a very high intrinsic order and uniform distribution of the source atoms on the surface of the target allowing to control the amount of initial dose of dopant and of the finally incorporated dopant in the substrate that can be therefore pre-determined once the molecule is designed. During this process, the molecule bonds to the target surface with a self-limiting process ruled by its steric properties. The molecular footprint of the precursor directly governs the surface concentration of the dopants with larger molecules resulting in a lower dose.

It must be noted that other embodiments of the invention have that, in step B, a dip coating may also be carried out by heating the solution at a dip coating temperature lower than the solution boiling temperature. In general, according to the invention, in step B, such dip coating temperature ranges from 65% to 100% of the solution boiling temperature (i.e. from about 80° C. to about 125° C. for a 20% solution of phosphoric acid in water, and from about 68° C. to about 105° C. for a similar solution of boric acid in water); optionally, such dip coating temperature can range from 80% to 100% of the solution boiling temperature (i.e. from about 100° C. to about 125° C. for a 20% solution of phosphoric acid in water, and from about 84° C. to about 105° C. for a similar solution of boric acid in water); more optionally such dip coating temperature can range from 90% to 100% of the solution boiling temperature (i.e. from about 112° C. to about 125° C. for a 20% solution of phosphoric acid in water, and from about 95° C. to about 105° C. for a similar solution of boric acid in water). In particular, molecular doping also takes place when this dip coating temperature in step B is below the solution boiling temperature, although method optimization is achieved when such dip coating temperature is the solution boiling temperature.

The inventors have conducted experiments by also exploring the results obtained when the solution is kept at room temperature in order to verify possible effectiveness of this simplified condition, together with several other dilutions. By bringing the solution to boiling temperature, the process of adhesion of the molecule to the substrate and consequent formation of the chemical bond is effective, with respect to the case at room temperature. With regard to the solution concentrations, the experiments showed that the proposed doping method works also when the dip coating is achieved by boiling the sample in PA only.

However, further experiments showed that a better efficacy in terms of simplicity and low cost is achieved when the sample is dipped in an aqueous solution with a PA concentration between 15% and 30%, optionally between 17% and 25%, more optionally between 18% and 22%, even more optionally with a PA concentration of 20%.

In step C, the annealing is configured to cause said dopant atoms included in said self-assembled mono-layer to be diffused into the sample. In particular, the annealing step is achieved by heating said sample at a temperature ranging from 1000° C. to 1100° C. for a period ranging from not less than 5 sec, optionally from not less than 20 sec, more optionally not more than 1000 sec, even more optionally not more than 500 sec.

To test the efficacy of PA as a molecular precursor, the method has been tested on silicon, using methods similar to those of MD, to exploit the low cost, simplicity, speed of process and conformity to conventional technologies, without the need of using expensive equipment and materials which are dangerous for the environment and operators.

Figure 2:
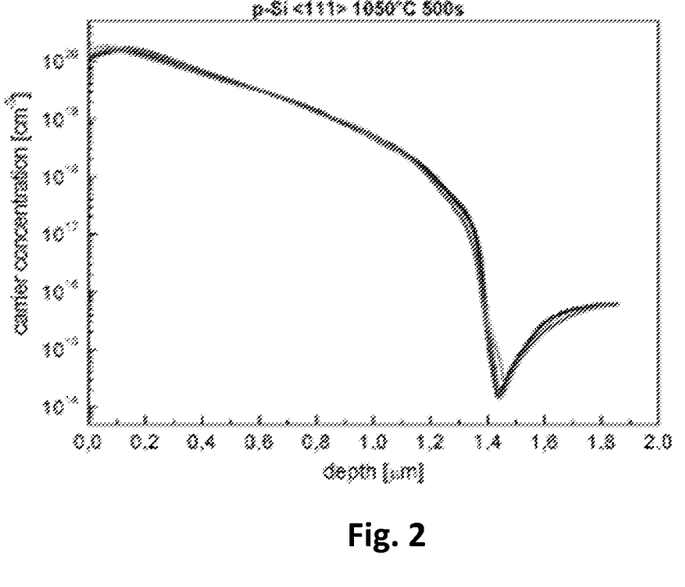
FIG. 2 shows a schematic view of SRP profiles of samples doped according to the doping method of FIG. 1 by phosphoric acid and annealed at 1050° C. for 500 sec.
Figure 4:
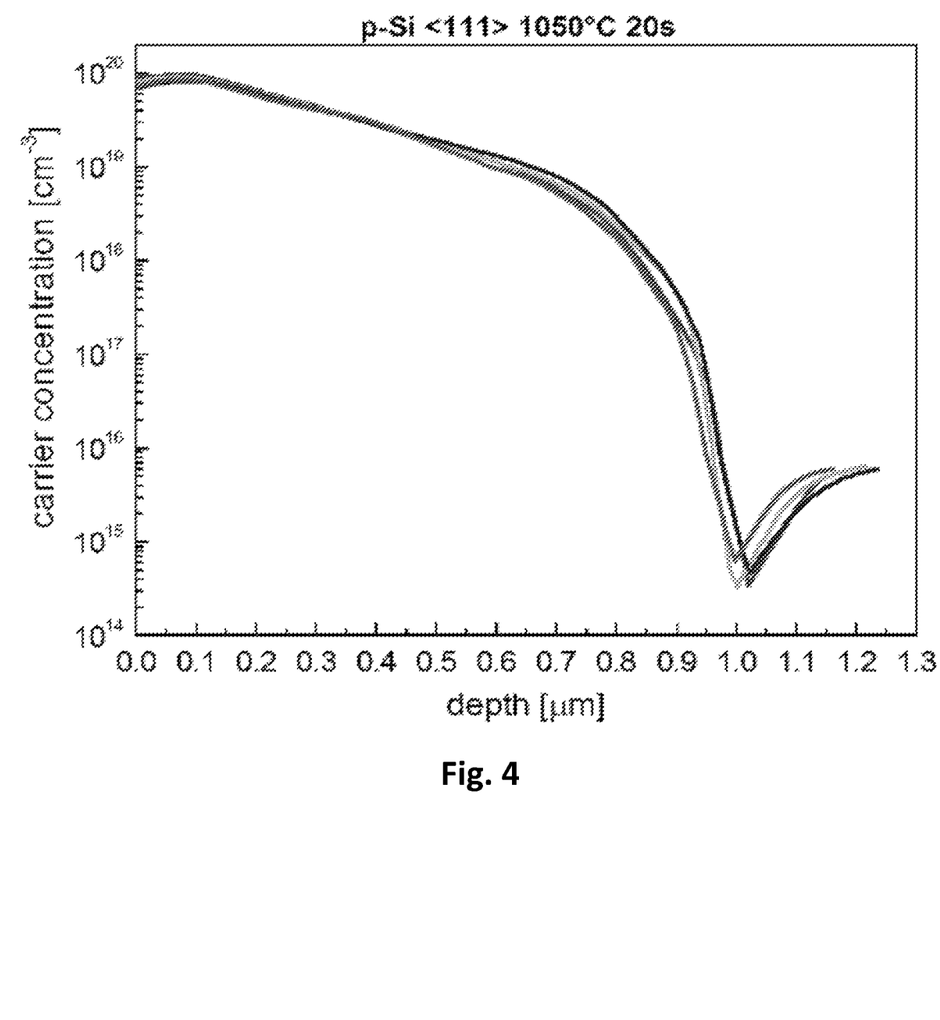
FIG. 4 shows a schematic view of a SRP profile of the samples doped according to the doping method of FIG. 1 by phosphoric acid and annealed at 1050° C. for 20 sec.

A characterization of the doped samples has been carried out as follows. In order to measure the concentration of electrically active carriers, which represents the yield of the method, the chosen methodology was the Spreading Resistance Profiling (SRP). Said measure allows an advanced carrier profiling as a function of the sample depth. FIGS. 2 and 4 show the results obtained on four different samples doped with phosphoric acid and processed at the same annealing temperature after the deposition. The curves are superimposed, which demonstrates a high repeatability of the method.

Figure 3:
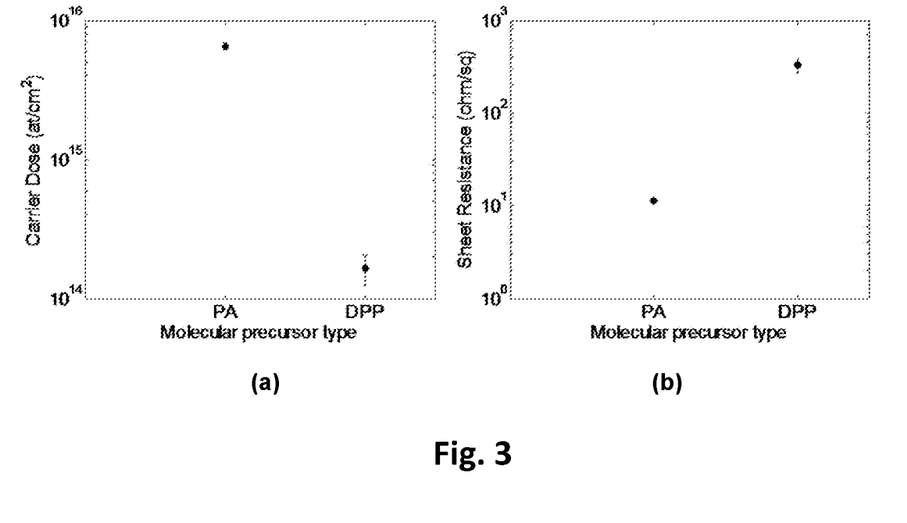
FIG. 3 shows a schematic view of a) Carrier dose and b) Sheet Resistance calculated from SRP profile of the samples doped by PA according to the doping method of FIG. 1 and by DPP according to a prior art method.

In the case of FIG. 2 the dose is about $6.5 \times 10^{15}$ atoms/cm$^2$ and the junction depth reaches more than 1.4 microns. The differences are remarkable by comparing these samples with those doped with DPP in mesitylene as shown in FIG. 3(a). Experimental results demonstrate outstanding doping efficiency with a concentration of peak electrical carriers of $1 \times 10^{20}$ atoms/cm$^3$. Indeed, in this case the dose values obtained with the PA doping method are more than one order of magnitude greater than the DPP method, moreover the junction depth values are about 5-6 times larger and the Rs (the layer or Sheet Resistance, see FIG. 3(b)) is less than one order of magnitude. Moreover, as can be seen in the FIG. 3(a), the samples doped with phosphoric acid have a lower error bar than DPP-doped samples, wherein the error bars have been quantified as the standard deviation calculated on the statistics of the several samples.

In order to verify whether the diffusion length of the charge carriers measured in samples doped with PA can be modulated through the annealing time, a second process was carried out by varying the annealing time from 500 seconds to 20 seconds. Also in this case, the samples were characterized by SRP and the profiles were shown in FIG. 4. Even in this case, the profiles obtained are overlapped between them and, by comparing them with the previous data, it is possible to note that the junction depth value is less (about 1 micron, against 1.4 microns in previous data), while the dose is about half of that obtained in the case of 500 sec ($3 \times 10^{15}$ atoms/cm$^2$). Thus, the obtained data show that the heating condition at 1050° C. for 20 sec can be an alternative process.

The promising results obtained by PA can be attributed to the small size of the molecule of phosphoric acid with respect to the DPP, which allow a greater packing and consequently a higher surface density of dopant atoms.

As anticipated, the semiconductor is silicon, but the method is also applicable to other types of semiconductor materials such as GaN, Ge, GaAs, SIC, graphene, silicene, germanene, stanene and other elemental two-dimensional materials.

In other embodiments, said step B is carried out as follows. Once the native oxide has been removed from the surface of the sample, said sample is dip coated in a dopant carbon-free solution including a dopant phosphoric acid diluted in water wherein the concentration of said acid optionally ranges in volume from of 15% and 30%, optionally between 17% and 25%, more optionally between 18% and 22%, even more optionally of 20%.

In other embodiments of the method, optionally, the volume of water of said solution ranges from 70% and 85%, optionally from 75% and 83%, more optionally ranges from 78% and 82%, more optionally with a water concentration of 80%.

In further embodiments of the invention said at least one dopant is boron and the dopant based carbon free substance may be selected from the group comprising or consisting of boric acid or metaboric acid. Said precursors are chosen because their molecular structures, as in the PA case, are composed only of oxygen, hydrogen and boron, no carbon atom is present in order to avoid introduction of unwanted contaminants inside the substrate during the annealing process.

The concentration of said dopant boric and/or metaboric acid diluted in water, ranges in volume from of 15% and 30%, optionally between 17% and 25%, more optionally between 18% and 22%, even more optionally of 20%.

In the case of water and boric acid and/or metaboric acid, the boiling point of the solution, at the selected concentration, ranges from 102° C. to 110° C.

As shown in FIG. 1, before step A, the following optional step D may be executed: cleaning (100) said at least part of the surface to remove the organic and non-organic surface contaminants.

In some embodiments of the invention, said step D is carried out by cleaning said at least part of the surface in ultrasonic in one or more cleaning solutions selected from the group comprising acetone, alcohol and water.

According to further embodiments of the invention, step D is achieved by executing the following cleaning sequence:
dipping said at least part of the surface in an acetone solution,
extraction from the solution and drying said at least part of the surface,
dipping said at least part of the surface in an alcohol solution,
extraction from the solution and drying said at least part of the surface,
dipping said at least part of the surface in an aqueous solution,
extraction from the solution and drying said at least part of the surface.

However, semiconductor samples already cleaned can be provided, making it clear that the contaminants cleaning and the oxide removal is not an essential feature of the method according to the invention. Possibly, already cleaned samples and/or samples from which oxides have been already removed may be provided in order to have the doping steps of the method executed.

Furthermore, as shown in FIG. 1, a protective layer can be applied to the doped sample surface. In this case, the following step E is performed before step C: capping (500) said least part of the surface with a layer of oxide. Said capping layer prevents molecular components, such as phosphorus and boron, from evaporate from the surface and it also ensures the dopant atoms' diffusion towards the semiconductor. In this case, the evaporation is reduced and the diffusion phenomenon prevails. Said capping layer can be applied on the surface samples through method such as spin on glass deposition procedure or by chemical vapor deposition.

The preferred embodiments of this invention have been described and a number of variations have been suggested hereinbefore, but it should be understood that those skilled in the art can make variations and changes, without so departing from the scope of protection thereof, as defined by the attached claims.

The invention claimed is:

1. A method, comprising:
   removing oxides from at least part of a surface of a semiconductor sample;
   forming a self-assembled mono-layer including dopant atoms by dip coating said at least part of the surface of the semiconductor sample in a dopant based carbon-free solution of at least one dopant based carbon-free substance diluted in water, wherein said at least one dopant based carbon-free substance has a molecule comprising at least one dopant atom, the dip coating includes boiling the dopant based carbon-free solution and immersing the at least part of the surface in the boiling solution, and wherein the dopant based carbon-free solution includes a volume of water from 70% to 85%; and
   diffusing dopant atoms of the self-assembled mono-layer into the sample by annealing said sample for a time ranging from 5 to 1000 seconds.

2. The method of claim 1, wherein boiling occurs for a period of time ranging from 2 to 3 hours.

3. The method of claim 1, wherein forming the self-assembled mono-layer includes forming one or more layers including dopant atoms from the dopant based carbon-free solution on the self-assembled mono-layer.

4. The method of claim 1, wherein said at least one dopant atom is double linked to a corresponding oxygen atom.

5. The method of claim 1, wherein said at least one dopant atom is phosphor or boron.

6. The method of claim 5, wherein said at least one dopant based carbon-free substance is selected from a group of: phosphoric acid, boric acid, and metaboric acid.

7. The method of claim 1, wherein said semiconductor sample is selected from a group of: silicon (Si), gallium nitride (GaN), gallium arsenide (GaAs), germanium (Ge), silicon carbide (SIC), graphene, silicene, germanene, stanene, and elemental two-dimensional materials.

8. The method of claim 1, wherein said dopant based carbon-free solution includes a volume of phosphoric acid from 15% and to 30%.

9. The method of claim 1, wherein the annealing includes heating said sample at a temperature ranging from 1000° C. to 1100° C.

10. The method of claim 1, comprising removing organic and non-organic surface contaminants by cleaning said at least part of the surface.

11. The method of claim 10, wherein cleaning said at least part of the surface in ultrasonic in one or more cleaning solutions which are selected from a group of: acetone, alcohol, and water.

12. The method of claim 10, wherein the cleaning includes:
   dipping said at least part of the surface in an acetone solution;
   dipping said at least part of the surface in an alcohol solution; and
   dipping said at least part of the surface in an aqueous solution.

13. The method of claim 1, wherein the removing oxides includes immersing said at least part of the surface in a hydrofluoric acid solution.

14. The method of claim 1, wherein said dopant based carbon-free solution includes a volume of boric acid from 15% to 30%.

15. A method, comprising:
   forming a self-assembled mono-layer on a substrate, the forming including:
      applying a hydrofluoric acid solution to a surface of the substrate; and
      dip coating the surface of the substrate with a dopant based carbon-free solution having a molecule including at least one dopant atom, the dopant based carbon-free solution including a volume of water from 70% to 85%, a dip coating temperature being from about 65% to 100% of the boiling point temperature of the dopant based carbon-free solution, dip coating includes boiling the surface of the substrate in the dopant based carbon-free solution; and
   diffusing the dopant atoms into the substrate by annealing the substrate having the self-assembled mono-layer.

16. The method of claim 15, wherein the solution is a 20% solution of phosphoric acid in water, the boiling temperature is 120° C., and the boiling is carried out for a period of time ranging from 2 to 3 hours.

17. The method of claim 15, comprising:
   removing oxides by applying the hydrofluoric acid solution;
   removing organic and non-organic surface contaminants from the surface of the substrate before removing the oxides; and
   before annealing the substrate, forming a layer of oxide on the surface of the substrate.

18. The method of claim 15 wherein the dopant based carbon-free solution is diluted in water.

19. The method of claim 15, comprising forming one or more layers including dopant atoms on the self-assembled mono-layer.

20. The method of claim 15, wherein dip coating includes forming a covalent bond between dopant atoms and atoms of the substrate.

* * * * *

UNITED STATES PATENT AND TRADEMARK OFFICE
CERTIFICATE OF CORRECTION

PATENT NO. : 11,978,633 B2  
APPLICATION NO. : 17/608956  
DATED : May 7, 2024  
INVENTOR(S) : Rosaria Anna Puglisi et al.

Page 1 of 1

It is certified that error appears in the above-identified patent and that said Letters Patent is hereby corrected as shown below:

In the Claims

Column 11, Claim 8, Line 65:
"from 15% and to 30%." should read: --from 15% to 30%.--

Signed and Sealed this  
Thirty-first Day of December, 2024

Derrick Brent  
*Acting Director of the United States Patent and Trademark Office*